United States Patent [19]
Mihara et al.

[11] Patent Number: 6,140,155
[45] Date of Patent: Oct. 31, 2000

[54] METHOD OF MANUFACTURING SEMICONDUCTOR DEVICE USING DRY PHOTORESIST FILM

[75] Inventors: Ichiro Mihara, Tachikawa; Shoichi Kotani, Ome; Takeshi Wakabayashi, Sayama; Masami Hiramoto, Chofu, all of Japan

[73] Assignee: Casio Computer Co., Ltd., Tokyo, Japan

[21] Appl. No.: 09/459,019

[22] Filed: Dec. 10, 1999

[30] Foreign Application Priority Data

Dec. 24, 1998 [JP] Japan ................................. 10-376243
Mar. 17, 1999 [JP] Japan ................................. 11-072512

[51] Int. Cl.$^7$ .............................................. H01L 24/50
[52] U.S. Cl. ...................... 438/124; 438/613; 438/614; 438/678
[58] Field of Search ................................... 438/113, 115, 438/124, 126, 127, 612, 613, 614, 678

[56] References Cited

U.S. PATENT DOCUMENTS

| | | | |
|---|---|---|---|
| 4,159,222 | 6/1979 | Lebow et al. | 156/632 |
| 5,198,385 | 3/1993 | Devitt et al. | 438/233 |
| 5,202,151 | 4/1993 | Ushio et al. | 427/98 |
| 5,664,325 | 9/1997 | Fukotomi et al. | 29/848 |
| 5,719,439 | 2/1998 | Iwasaki et al. | 257/690 |

*Primary Examiner*—T. N. Quach
*Attorney, Agent, or Firm*—Frishauf, Holtz, Goodman, Langer & Chick, P.C.

[57] ABSTRACT

A plating tray includes a recessed region in a central portion of an insulating substrate for arranging therein a silicon semiconductor substrate and a metal film arranged to surround the recessed region. The semiconductor substrate is housed in the recessed region. Under this condition, a dry photoresist film containing Na, K, Ca and Cu in amounts smaller than predetermined amounts is formed to cover a metal underlying film. Then, a projecting electrode is formed by electroplating within open portions formed in the resist film. In forming the projecting electrode, the open portion is also formed in that region of the resist film which corresponds to the metal film of the plating plate so as to form a dummy projection electrode simultaneously.

20 Claims, 14 Drawing Sheets

METHOD OF MANUFACTURING SEMICONDUCTOR DEVICE USING DRY PHOTORESIST FILM

BACKGROUND OF THE INVENTION

The present invention relates to a method of manufacturing a semiconductor device, in which a projecting electrode or both the re-wiring and a projecting electrode are formed on a surface of a semiconductor device.

A semiconductor chip to which is applied a face down bonding is prepared by the steps of forming a projecting electrode on an external connection pad of a semiconductor wafer having an integrated circuit formed thereon, separating the semiconductor wafer into individual semiconductor chips by dicing, and bonding the projecting electrode to a connection terminal of a circuit substrate. In this method, the packaging for protecting the integrated circuit of the semiconductor chip is performed after the bonding step. Therefore, a long time is required for the packaging treatment after the bonding step.

Under the circumstances, vigorous studies are being made in an attempt to develop a wafer level packaging (WLP) technology in which projecting electrodes are formed on the semiconductor wafer and then a sealing resin is formed on the upper surface of the semiconductor wafer, followed by dicing the semiconductor wafer. According to the WLP method, a resin sealing for protecting the integrated circuit is formed on the semiconductor wafer. Thus, the WLP method is highly efficient, compared with the conventional method of individually packaging the semiconductor chip. A conventional WLP technology will now be described briefly.

Specifically, FIG. 13A is a plan view showing a silicon semiconductor substrate, and FIG. 13B is a cross sectional view along the line XIIIB—XIIIB shown in FIG. 13A which shows in a magnified fashion a part of the substrate. As shown in the figures, connection pads 4 are formed on a silicon semiconductor substrate 1 of a wafer state having semiconductor integrated circuits formed thereon. That portion of the semiconductor substrate 1 on which the connection pads 4 are not formed is covered with an insulating film 2 consisting of, for example, a silicon oxide film. The insulating film 2 has a rectangular open portion 3 positioned above the connection pad 4. Also, an underlying metal layer 5 is formed on substantially the entire surface of the insulating film 2 such that the metal layer 5 is electrically connected to the connection pad 4 via the open portion 3. Under this condition, the entire upper surface of the underlying metal layer 5 is coated with a liquid photoresist in a thickness of 60 $\mu$m to 200 $\mu$m, followed by light exposure and development using a suitable mask so as to selectively remove the photoresist layer at three peripheral portions 5a of the semiconductor substrate 1 and at the portions positioned above the connection pads 4, thereby forming a plating resist pattern 6. The three peripheral portions 5a are not covered with the plating resist pattern 6 to permit the underlying metal layer 5 to be exposed to the outside. It should be noted that these exposed portions 5a are used as one of plating electrodes and serve to ensure sealing properties in the peripheral regions of the upper surface of the underlying metal layer 5 in the plating step. Incidentally, dot-and-dash lines in FIG. 13A represent dicing lines.

Then, an electroplating of, for example, copper is performed by using the plating resist pattern 6 as a mask and the underlying metal layer 5 as one of plating current passageways so as to form a columnar projecting electrodes 7 (see FIG. 14), each of which has a height of 60 $\mu$m to 200 $\mu$m, in direct contact with the underlying metal layer 5 in a manner to fill an opening 6a of the plating resist pattern 6. After formation of the columnar electrode 7, the plating resist pattern 6 is peeled off, followed by removing by etching an undesired portion of the underlying metal layer 5 using the projecting electrode 7 as a mask. Then, a sealing film 8 consisting of an epoxy resin, a polyimide resin, or the like is formed on the insulating film 2. Finally, the silicon substrate 1 is diced along the dicing lines denoted by dot-and-dash lines in FIG. 13A so as to obtain a plurality of semiconductor chips (semiconductor devices) as shown in FIG. 14.

In forming the plating resist pattern 6 on the underlying metal layer 5, the underlying metal layer 5 is generally coated by a spin coating method with a liquid photoresist having a viscosity of at least several thousands of centipoises (cP). However, a liquid photoresist having such a high viscosity is poor in fluidity, making it difficult to form a photoresist layer of a uniform thickness on the semiconductor substrate. In other words, the coated photoresist layer has a roughened surface. As a result, the light exposure development fails to be uniform, leading to an increased nonuniformity in the height of the projecting electrode 7. In order to overcome this difficulty, it is proposed to have the underlying metal layer 5 covered with a dry photoresist film in place of using the liquid photoresist.

However, when the projecting electrode 7 was formed by using a dry photoresist film available on the market, metal impurities contained in the dry photoresist film were found to be precipitated on the surface of the projecting electrode 7 and on the surface of the insulating film 2 interposed between adjacent projecting electrodes 7 so as to bring about a defective insulation.

It should also be noted that, in the case of utilizing an electroplating for forming the projecting electrode 7, the plated amount of the metal is gradually increased toward the outer periphery of the semiconductor substrate 1 because of the density of the lines of electric force during the electroplating step, though the metal is uniformly plated in a central portion of the substrate 1. As a result, where no measure is taken against the problem, the projecting electrode 7 formed in an outer peripheral portion of the semiconductor substrate 1 is rendered higher than that formed in a central portion of the substrate 1, giving rise to nonuniformity in the height of the projecting electrode 7. Such being the situation, an open portion 6b for forming a dummy projecting electrode is formed in the plating resist layer 6 outside the effective area in which semiconductor chips are obtained as shown in FIG. 13A. In this case, a dummy projecting electrode is formed in direct contact with the underlying metal layer 5 to fill the opening 6b for the dummy projecting electrode. As a result, the projecting electrodes 7 formed within the effective area of the silicon substrate 1 are made uniform in height. However, where the area in which the dummy projecting electrodes are formed is small, the projecting electrodes 7 formed within the effective area fail to be made sufficiently uniform in height. On the other hand, where the area for forming the dummy projecting electrodes is sufficiently large, the effective area is diminished.

BRIEF SUMMARY OF THE INVENTION

A first object of the present invention is to provide a method of manufacturing a semiconductor device, which permits preventing a defective insulation caused by the metal impurities contained in the photoresist.

A second object of the present invention is to provide a method of manufacturing a semiconductor device, which permits forming columnar electrodes of a uniform height within an effective area of a semiconductor substrate without diminishing the effective area.

The other objects of the present invention will be apparent from the following detailed description of the present invention.

According to the present invention for achieving the first object, there is provided a method of manufacturing a semiconductor device, comprising:

preparing a semiconductor substrate having a main surface, and a plurality of connection pads formed on the main surface, the main surface being covered with an insulating film including open portions partly exposing each of the connection pads;

forming a metal layer electrically connected to the connection pads;

laminating a dry photoresist film on the metal films, the dry photoresist film containing at most 100 ppb of Na, at most 50 ppb of K, at most 50 ppb of Ca and at most 50 ppb of Cu;

forming an open portion in the dry photoresist film to expose partly each of the metal layers;

forming within the open portion by an electroplating a thick metal film electrically connected to the metal layer; and removing off the dry photoresist film from the metal films.

According to the present invention for achieving the second object, there is provided a method of manufacturing a semiconductor device, comprising:

preparing a semiconductor substrate having a main surface, a plurality of connection pads being formed on the main surface and the entire region of the one main surface, which includes the plural connection pads, being covered with a metal layer;

preparing a plating tray having a semiconductor substrate arranging region and a metal film formed to surround the semiconductor substrate arranging region;

mounting the semiconductor substrate in the semiconductor substrate arranging region of the plating tray;

electrically connecting the metal layer of the semiconductor substrate to the metal film of the plating tray;

covering the semiconductor substrate and the semiconductor substrate arranging region of the plating tray with a plating resist;

forming an open portion for forming a projecting electrode, in that region of the plating resist which corresponds to the semiconductor substrate and also forming an open portion for forming a dummy projecting electrode, in that region of the plating resist which corresponds to the semiconductor substrate arranging region of the plating tray;

forming a projecting electrode by electroplating in each of the open portion for forming the projecting electrode of the plating resist and in the open portion for forming the dummy projecting electrode of the plating resist; and removing the plating resist from the semiconductor substrate and the plating tray.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION [First Embodiment]

Figure 1:
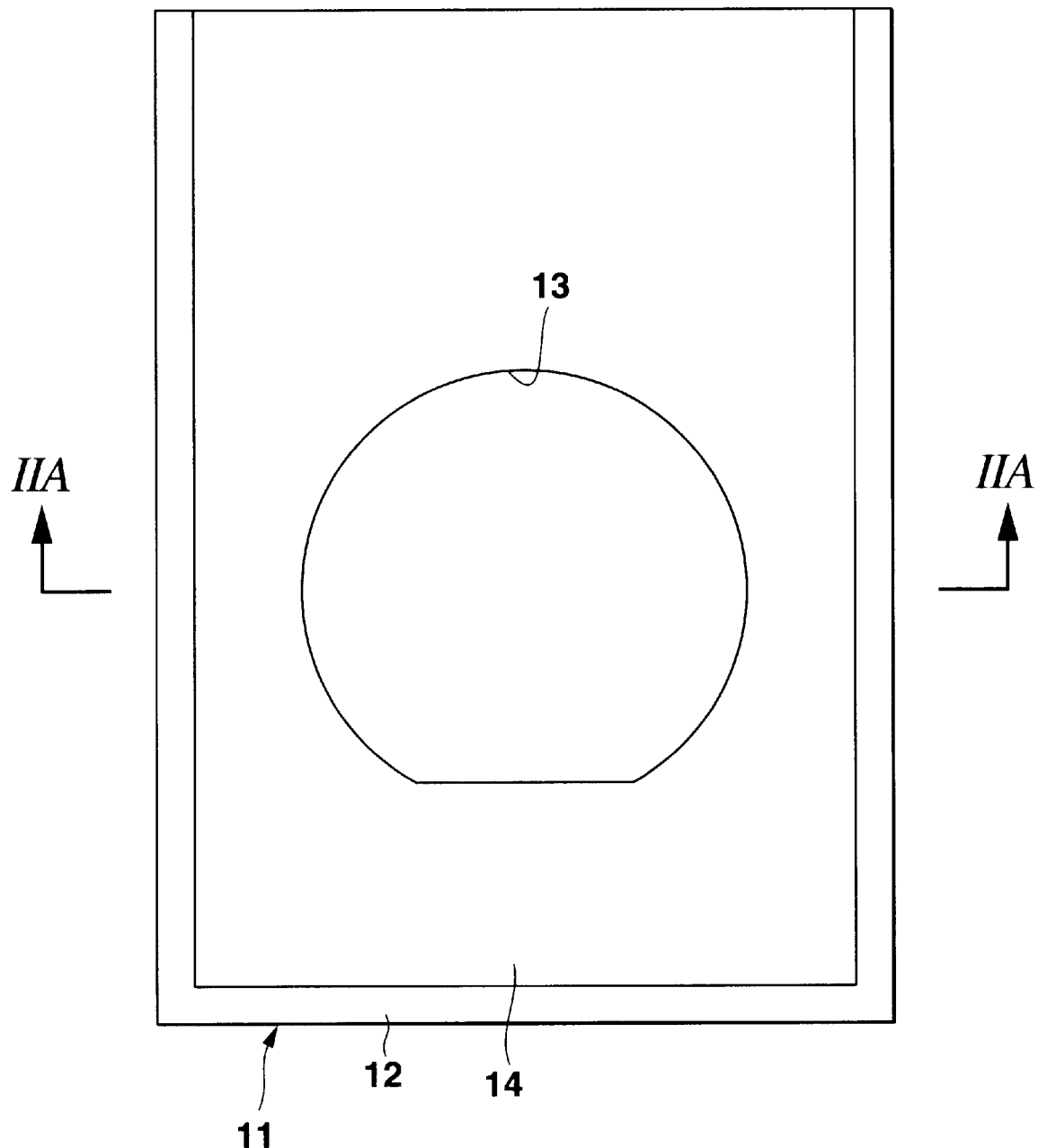
FIG. 1 is a plan view showing a plating tray prepared initially for forming a projecting electrode of a semiconductor device according to a first embodiment of the present invention.
Figure 2A:
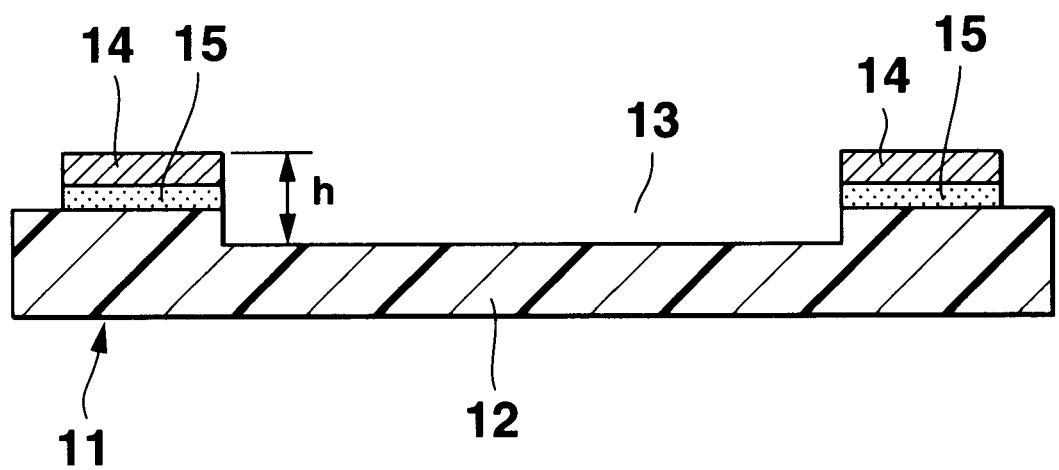
FIG. 2A is a cross sectional view along the line IIA—IIA shown in FIG. 1.

FIG. 1 is a plan view showing a plating tray 11 prepared initially for manufacturing a semiconductor device according to a first embodiment of the present invention, and FIG. 2A is a cross sectional view along the line IIA—IIA shown in FIG. 1. The plating tray 11 comprises an oblong plate-like insulating substrate 12 having a semiconductor substrate or wafer arranging region 13 formed in substantially the central portion. The region 13 is equal in shape to a semiconductor substrate and forms a recess having a depth somewhat smaller than the thickness of the semiconductor substrate. A metal film 14 is attached to the insulating substrate 12 by an adhesive 15 in a manner to surround the semiconductor substrate arranging region 13. As shown in FIG. 1, the metal film 14 is formed to reach the edge at one side of the oblong insulating substrate 12 but not to reach the edges at the other three sides of the insulating substrate 12.

Figure 2B:
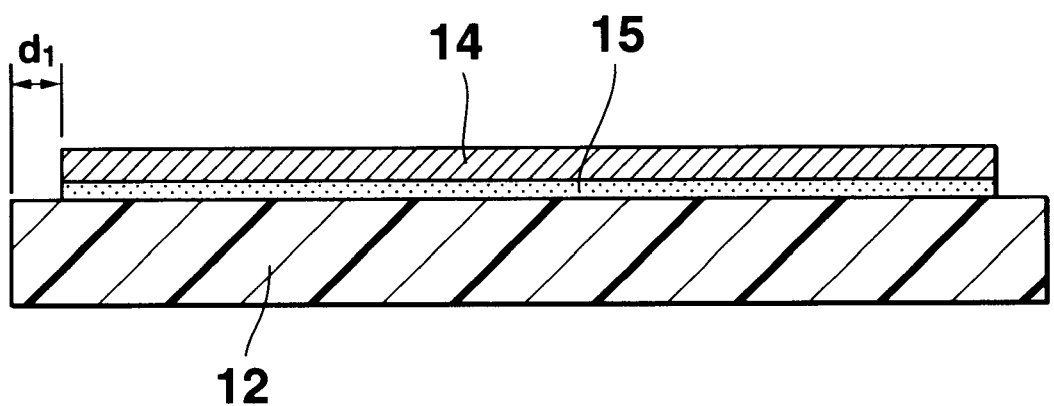
FIG. 2B is a cross sectional view exemplifying a method of forming a plating tray.

How to prepare the plating tray will now be described. As shown in FIG. 2B, prepared is a laminate structure including the insulating substrate 12 consisting of an oblong glass or epoxy plate having a thickness of about 1 to 4 mm and a metal film 14 such as a copper foil formed on one surface of the insulating substrate 12 with the adhesive 15 made of, for example, an epoxy resin interposed therebetween. The particular laminate structure is generally available on the market as a copper-lined circuit substrate. The metal film 14, which need not be limited at all, should desirably have a thickness of about 18 $\mu$m. The metal film 14 bonded to the insulating substrate 12 is removed by etching or another appropriate method at three side portions of the insulating substrate 12 in a predetermined width d1 e.g., width d1 of about 10 mm. Also, the semiconductor substrate arranging region 13 is provided by a recess formed by using, for example, a face milling cutter in a central portion of the insulating substrate 12 having the metal film 14 bonded thereto. The recessed region 13 substantially conforms with the silicon substrate in a wafer state in size and shape and has a diameter about 0.4 mm larger than the silicon substrate. The recessed region 13 has a depth about ½ to 1 time as large as the thickness of the semiconductor substrate having a underlying metal layer formed thereon, as described hereinlater in detail. In the example shown in FIG. 2A, the depth h is substantially equal to the thickness of the semiconductor substrate provided with the underlying metal layer.

Figure 3:
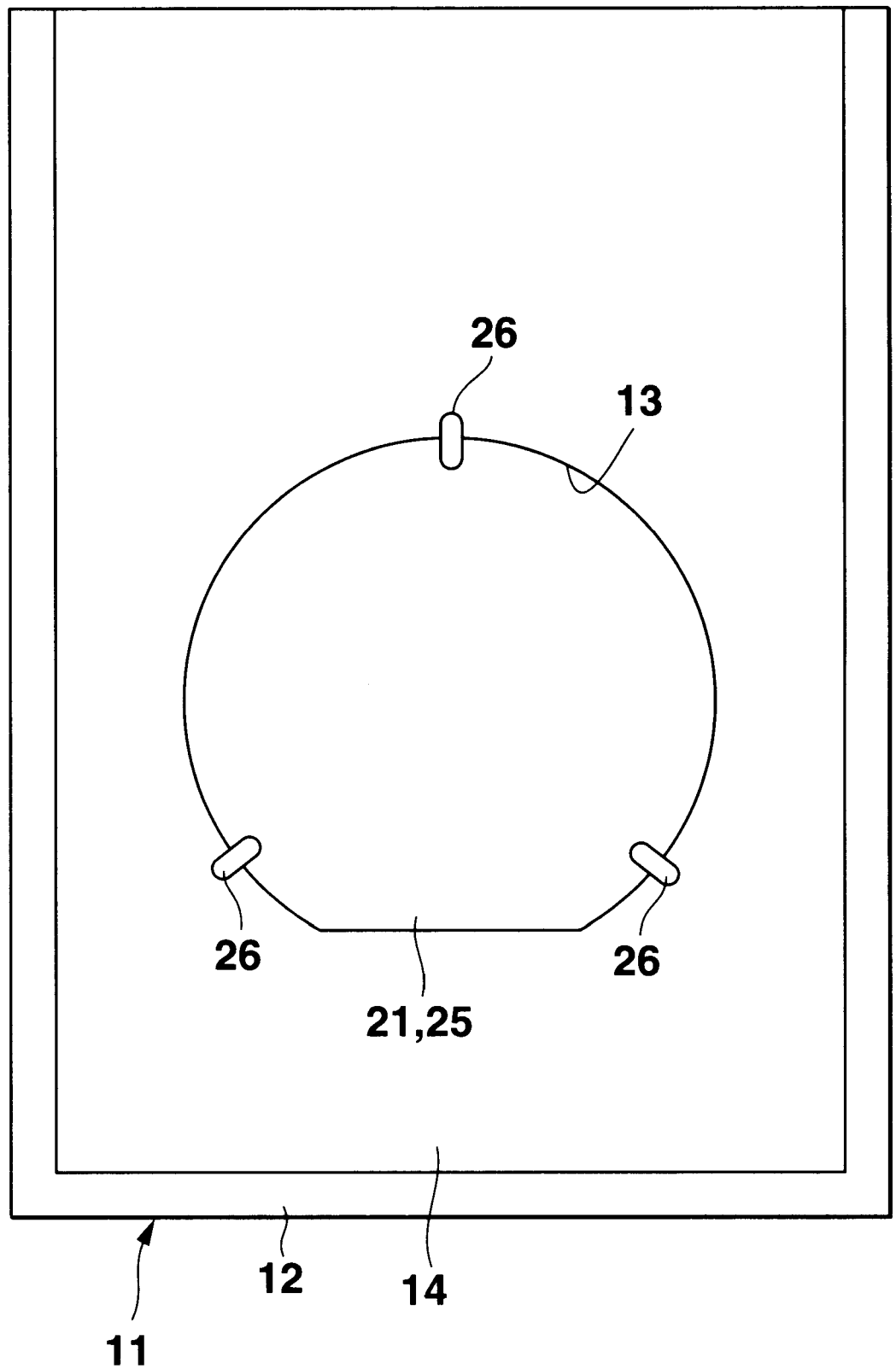
FIG. 3 is a plan view showing that a semiconductor substrate is mounted on a plating tray.
Figure 4A:
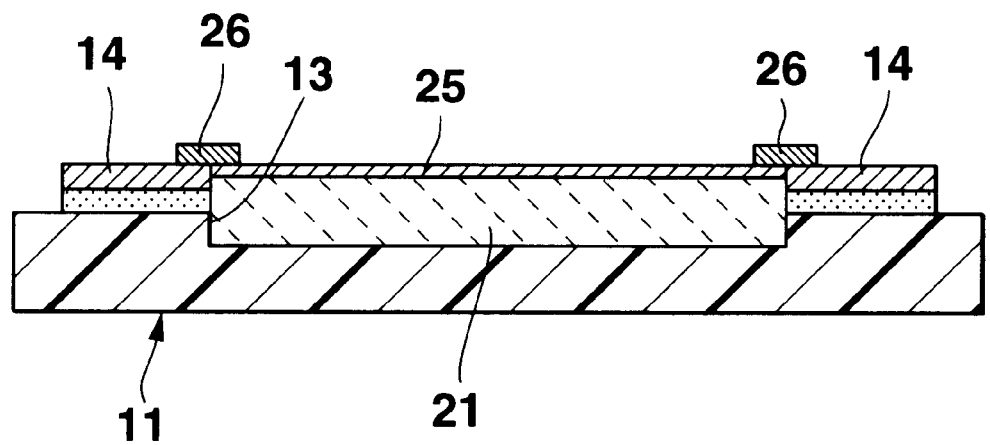
FIG. 4A is a cross sectional view showing a part of an assembly shown in FIG. 3.
Figure 4B:
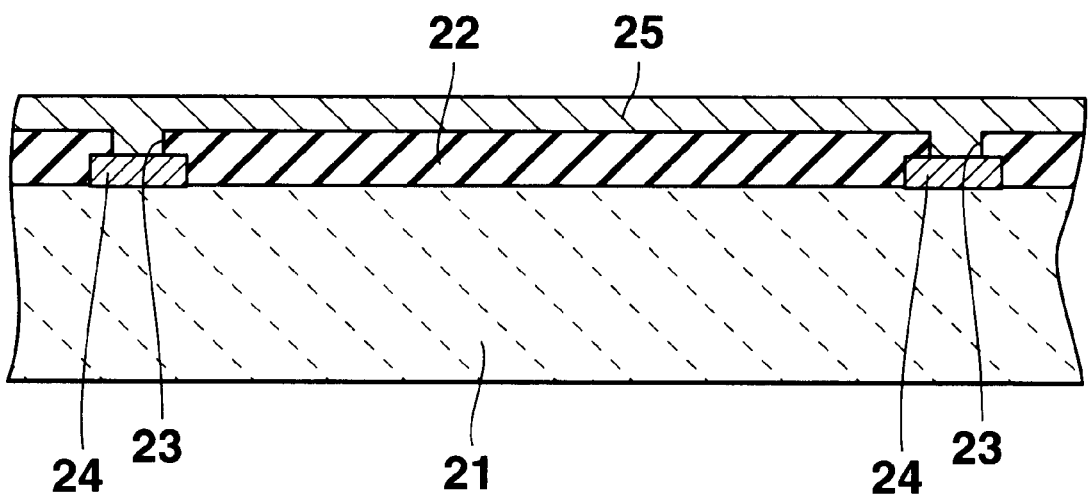
FIG. 4B is a cross sectional view showing in a magnified fashion the part of the assembly shown in FIG. 4A.
Figure 7:
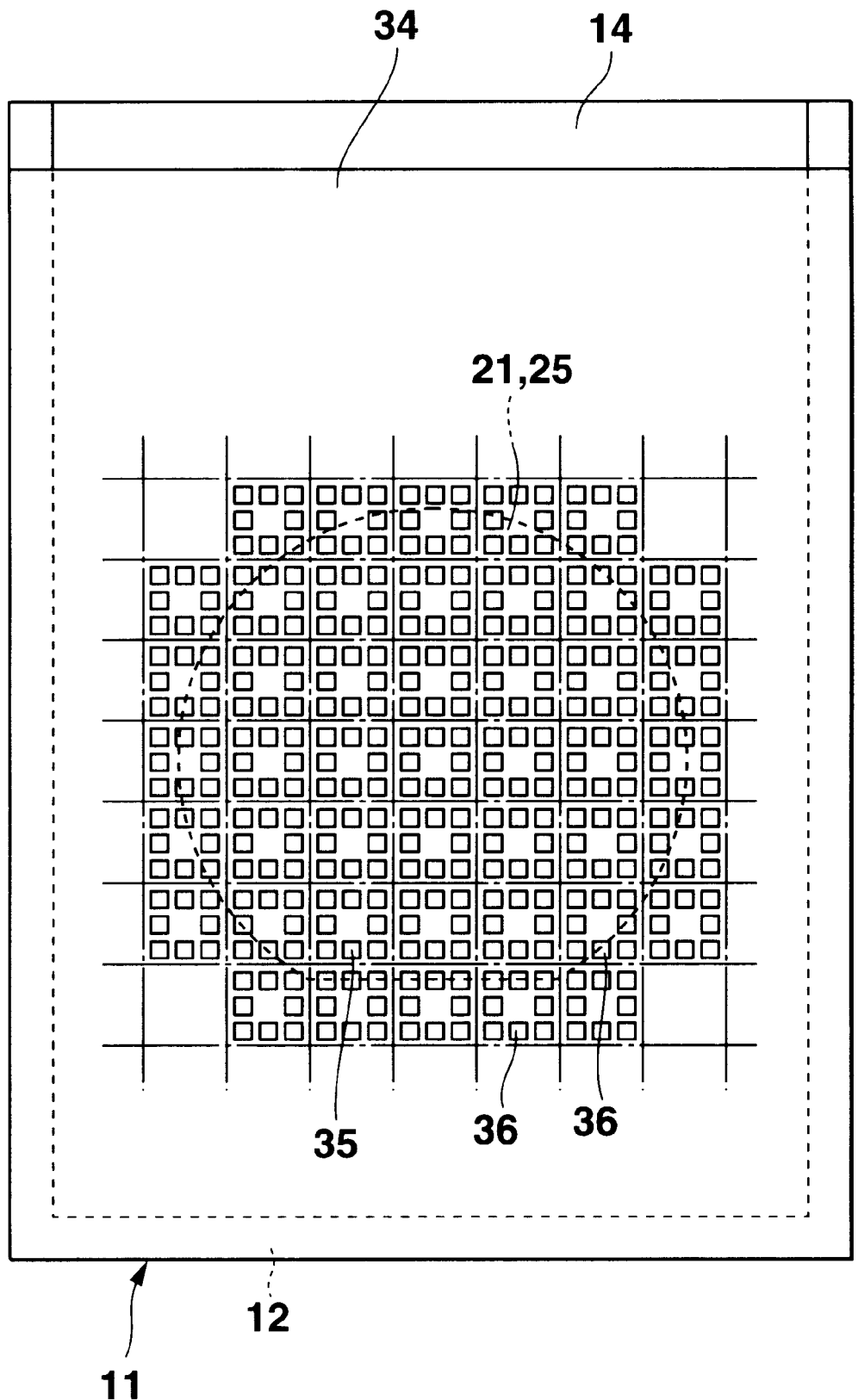
FIG. 7 is a plan view for illustrating a manufacturing step following the manufacturing step shown in FIG. 6.

As shown in FIGS. 3 and 4A, a silicon semiconductor substrate 21 in a wafer state is arranged within the recessed region 13. FIG. 4B shows in a magnified fashion the semiconductor substrate 21 arranged within the recessed region 13. As shown in the figure, a plurality of connection pads 24 are formed on the semiconductor substrate 21. The region shown in FIG. 4B covers a single semiconductor chip after the dicing step and, thus, a pair of connection pads 24 alone are shown in the figure. However, the semiconductor substrate 21 is large enough to include a large number of such semiconductor chips as shown in FIG. 7, which will be described hereinlater. An insulating film 22 is formed to cover the connection pads 24 and the semiconductor substrate 21. The insulating film 22 extends over the entire surface of the semiconductor substrate and is provided with an open portion 23 for exposing the central portion of each of the connection pads 24. An underlying metal layer 25 is formed to cover the connection pads 24 exposed to the outside by the open portions 23 and over the entire region of the insulating film 22.

As shown in FIGS. 3 and 4A, the three peripheral portions on the upper surface of the underlying metal layer 25 are connected to the upper surface of the metal layer 14 by three conductive members 26 under the condition that the semiconductor substrate 21 provided with the underlying metal layer 25 is housed in the recessed region 13 that forms a semiconductor arranging region of the plating tray 11. These conductive members 26 can be formed by coating the particular three points with a conductive paste by, for example, a screen printing method, a dispenser method, or a transfer method. It is possible to use, for example, a metal foil or a metal wire in place of the conductive paste. Also, the connecting portions are not limited to the three points noted above. The conductive member 26 is attached to a predetermined position and, then, covered with a laminate of a dry resist layer described herein later, regardless of the material of the conductive member 26, so as to keep the conductive member 26 fixed thereto.

Figure 5A:
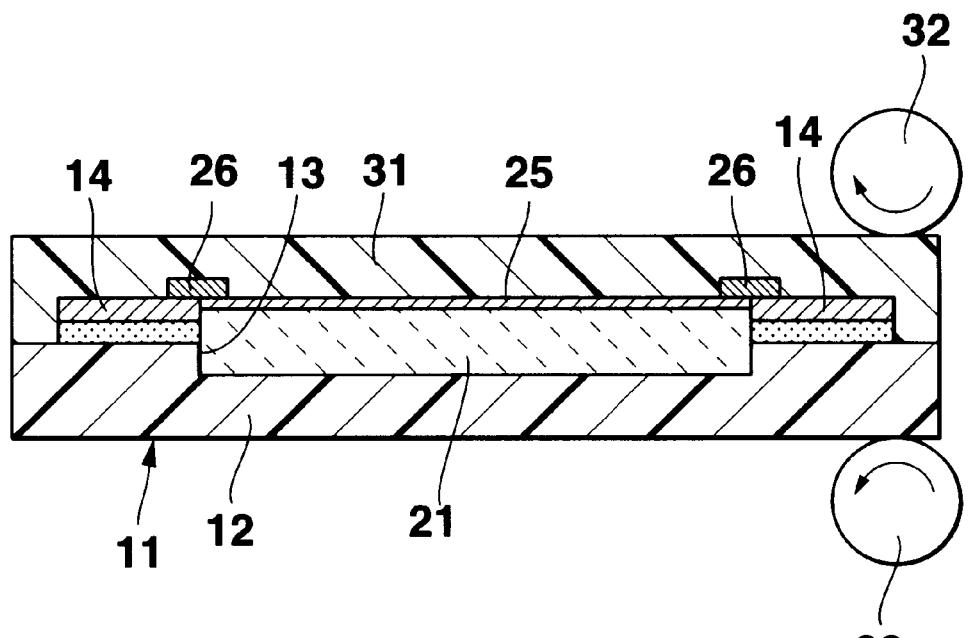
FIG. 5A is a cross sectional view for illustrating a manufacturing step following the step shown in FIG. 4A.
Figure 5B:
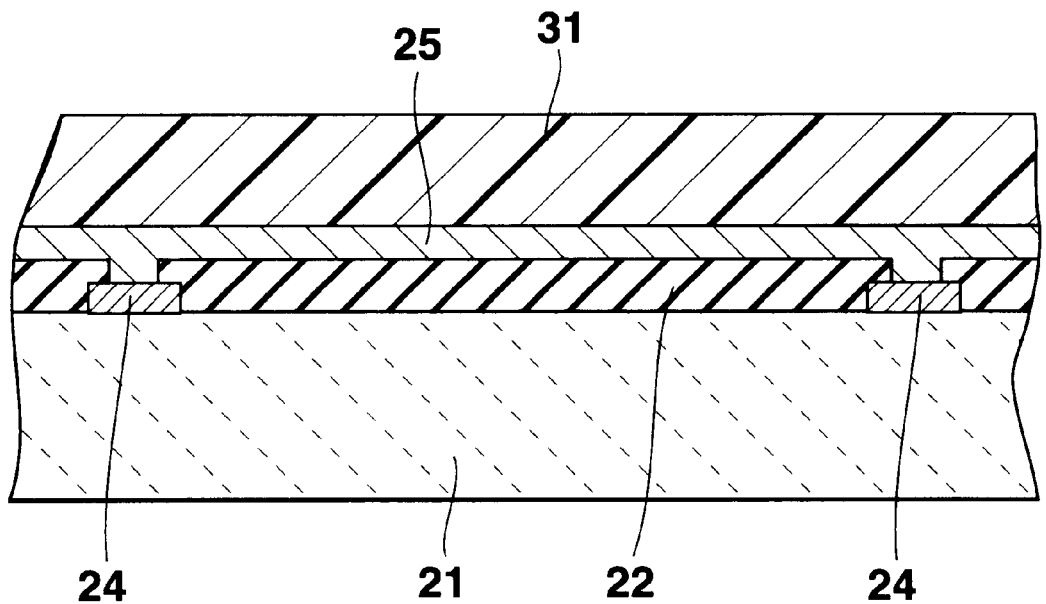
FIG. 5B is a cross sectional view for illustrating in a magnified fashion a part of the semiconductor substrate shown in FIG. 5A.

In the next step, a dry resist film 31 is superposed on the upper surface of the plating tray 11 including the upper surfaces of the metal film 14, the underlying metal layer 25 and the conductive member 26. Under this condition, the superposed structure is moved between a pair of pressurizing heating rollers 32 and 33 from the right to the left in FIG. 5A. FIG. 5B shows the state after the movement. As a result, the dry photoresist film (plating resist) 31 is tightly laminated on the upper surface of the plating tray 11 including the upper surface of the underlying metal layer 25. In this case, the dry photoresist film 31 is of negative type and has a thickness of 60 $\mu$m to 200 $\mu$m, typically about 100 $\mu$m to 150 $\mu$m. The metal impurities contained in the dry photoresist film should be not higher than 100 ppb for Na, not higher than 50 ppb for K, not higher than 50 ppb for Ca and not higher than 50 ppm for Cu, totaling 250 ppb. Incidentally, the dry photoresist film available on the market contains about 3,000 ppb of Na, about 500 ppb of K, about 1,000 ppb of Ca and about 500 ppb of Cu, totaling about 5,000 ppb. In other words, the impurities contained in the dry photoresist film available on the market are more than 20 times as much as those specified in the present invention. The dry photoresist film 31 containing small amounts of impurities is arranged on the plating tray 31 to cover substantially the entire surface of the plating tray 11, as shown in FIG. 5A, except that the metal film 14 alone is selectively exposed to the outside as described herein later. Under this condition, the dry photoresist film 31 is preheated at about 80° C. for about 3 minutes, followed by rotating the paired pressurizing heating rollers 32, 33 at a transfer rate of about 1 m/min and under a pressurizing force of 0.4 kg/cm$^2$ and a heating temperature of about 110° C. so as to achieve lamination of the dry photoresist film 31. By the lamination of the dry photoresist film 31, the semiconductor substrate 21 is fixed within the recessed region 13, which constitutes a semiconductor substrate arranging region, of the plating tray 11. Also, the conductive member 26 is kept fixed to the predetermined position.

Figure 6:
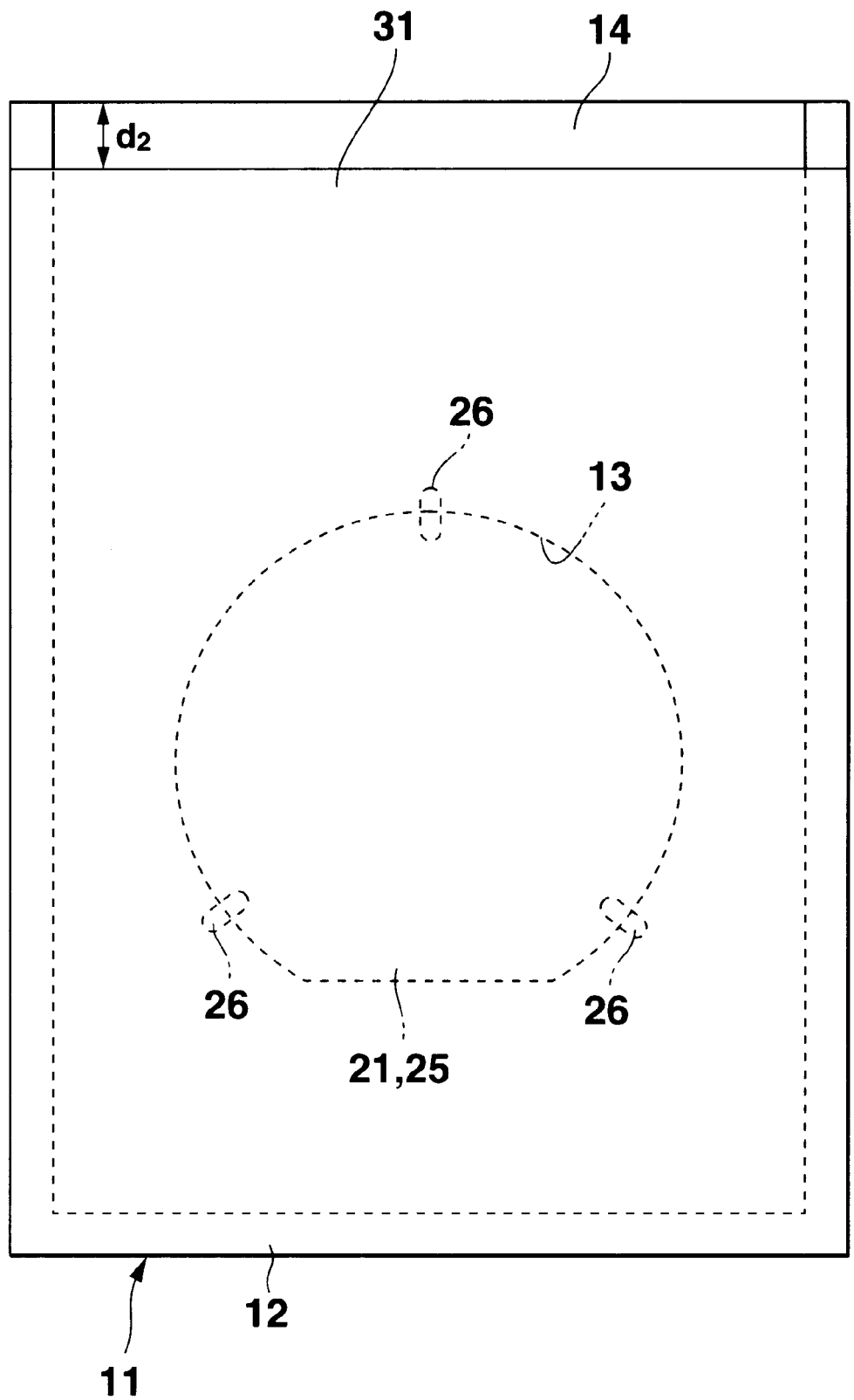
FIG. 6 is a plan view showing the plating tray and the semiconductor substrate shown in FIG. 5A.

It should be noted that the dry photoresist film 31 is not laminated on an upper side region on the upper surface of the plating tray 11, as shown in FIG. 6. As a result, that portion of the metal film 14 which is positioned in the upper side region of the plating tray 11 is not covered with the dry photoresist film 31 and, thus, is exposed to the outside. The exposed portion of the metal film 14 has a width $d_2$ of about 10 to 20 mm. By the lamination of the dry photoresist film 31, the entire surface of the plating tray 11 including the outer peripheral portion and excluding the upper side portion of the metal film 14 is sealed by the dry photoresist film 31.

Figure 8A:
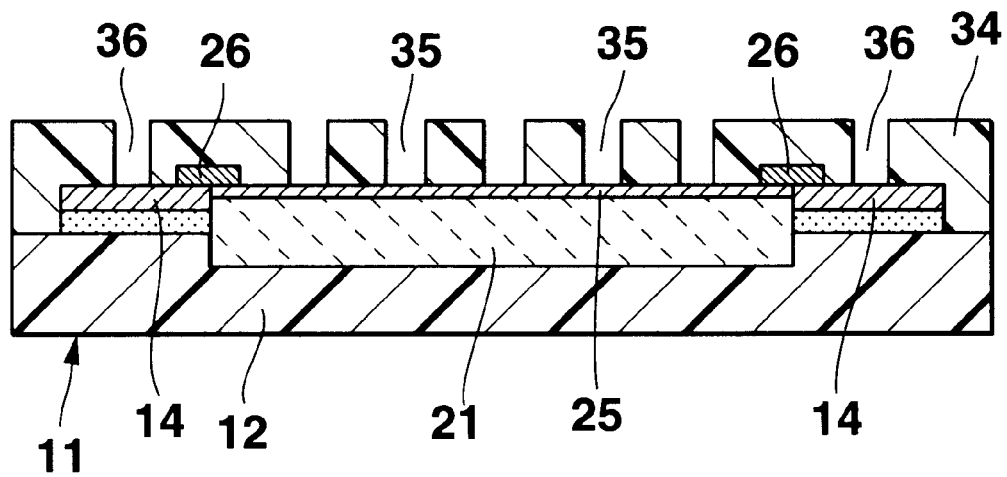
FIG. 8A is a cross sectional view showing a part of FIG. 7.
Figure 8B:
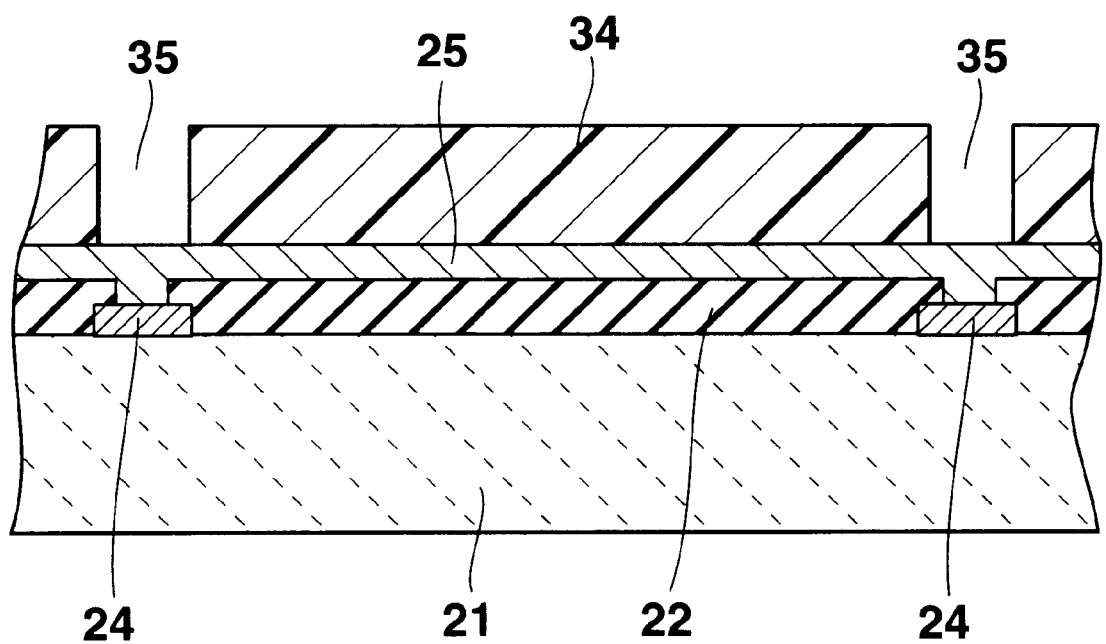
FIG. 8B is a cross sectional view showing in a magnified fashion a part of the semiconductor substrate shown in FIG. 8A.
Figure 10:
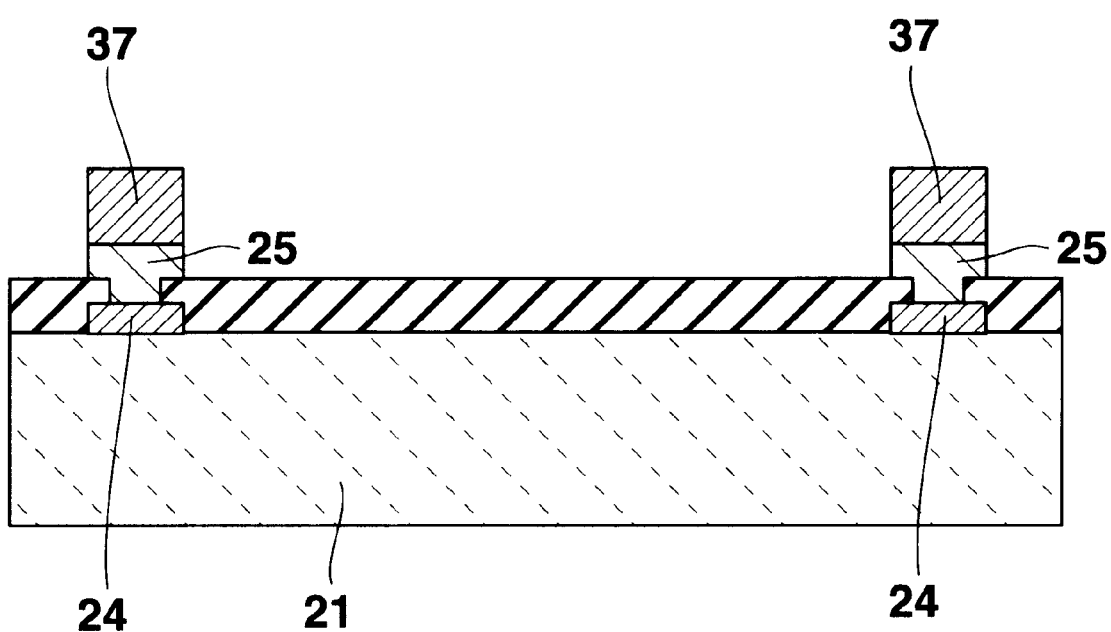
FIG. 10 is a cross sectional view showing in a magnified fashion a part (one chip) of the semiconductor substrate manufactured by the method according to the first embodiment of the present invention.

In the next step, the dry photoresist film 31 is selectively exposed to light and, then, developed so as to form a plating resist pattern 34, as shown in FIGS. 7, 8A and 8B. Under this state, an open portion 35 is formed in that portion of the plating resist pattern 34 which corresponds to the connection pad 24. Also, as shown in FIGS. 7 and 8A, open portions 36 for forming dummy projecting electrodes (dummy thick metal films) are formed in predetermined portions of the plating resist pattern 34 on the underlying metal layer 25 outside the effective area, i.e., area in which on semiconductor chip is obtained as shown in FIG. 10, of the silicon substrate 21, and in predetermined portions of the plating resist pattern 34 on the metal film 14 around the semiconductor substrate 21.

The method of light exposure and development for forming the plating resist pattern 34 will now be described more in detail. Specifically, the light exposure is performed by a stepper light exposure method or a light exposure method using a glass mask based on a position alignment using an alignment mark formed on the semiconductor substrate 21. The light exposure is performed by using a light having a wavelength of 390 to 450 nm. Where the light used has a wavelength of 420 nm, the light exposure amount is about 2800 to 3000 mJ. The development is performed by an $O_2$ plasma etching or by using a 1% solution of $Na_2CO_3$ as a developing solution. If the pattern (shape and area) of the open portion 36 for forming the dummy projecting electrode in the plating resist pattern 34 outside the effective area of the semiconductor substrate 21 is equal to the pattern of the open portion 35 for forming the real projecting electrode, the real pattern can be used for forming the open portion 36 for forming the dummy projecting electrode in the case of employing the stepper light exposure method, and a special pattern need not be formed in the case of employing the light exposure method using a glass mask.

In the next step, vapor of pure water, a plating solution, etc. is applied to the open portion 35 of the plating resist pattern 34 and the open portion 36 for forming the dummy projecting electrode so as to permit the vapor to be attached to at least the inner regions of the open portion 35 and the open portion 36 for forming the dummy projecting electrode. If the inner regions of the open portion 35 of the plating resist pattern 34 and the open portion 36 for forming the dummy projecting electrode are wetted by the vapor attachment, the air present inside the open portion 35 and the open portion 36 for forming the dummy projecting electrode is expelled, making it possible to prevent air bubbles from being involved in the electroplating step.

Figure 9A:
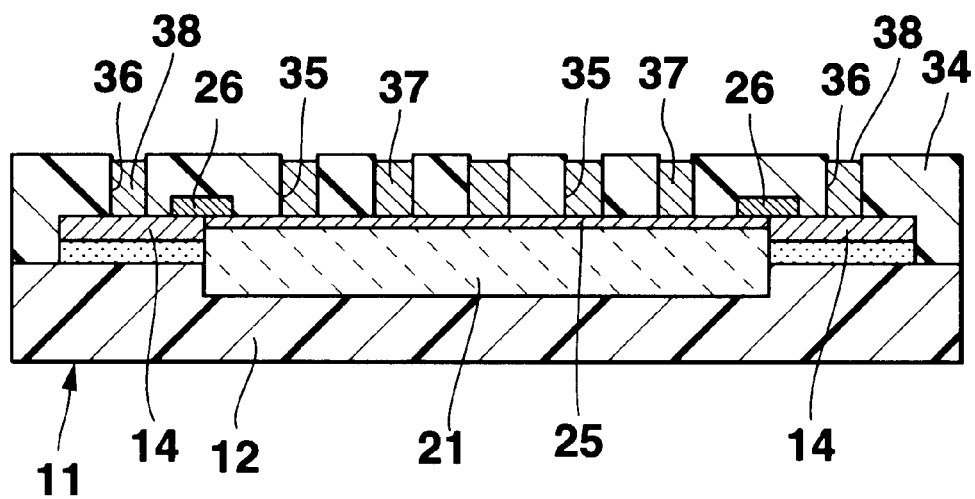
FIG. 9A is a cross sectional view showing a plating tray having a semiconductor substrate disposed thereon for describing a manufacturing step following the step shown in FIG. 8A.
Figure 9B:
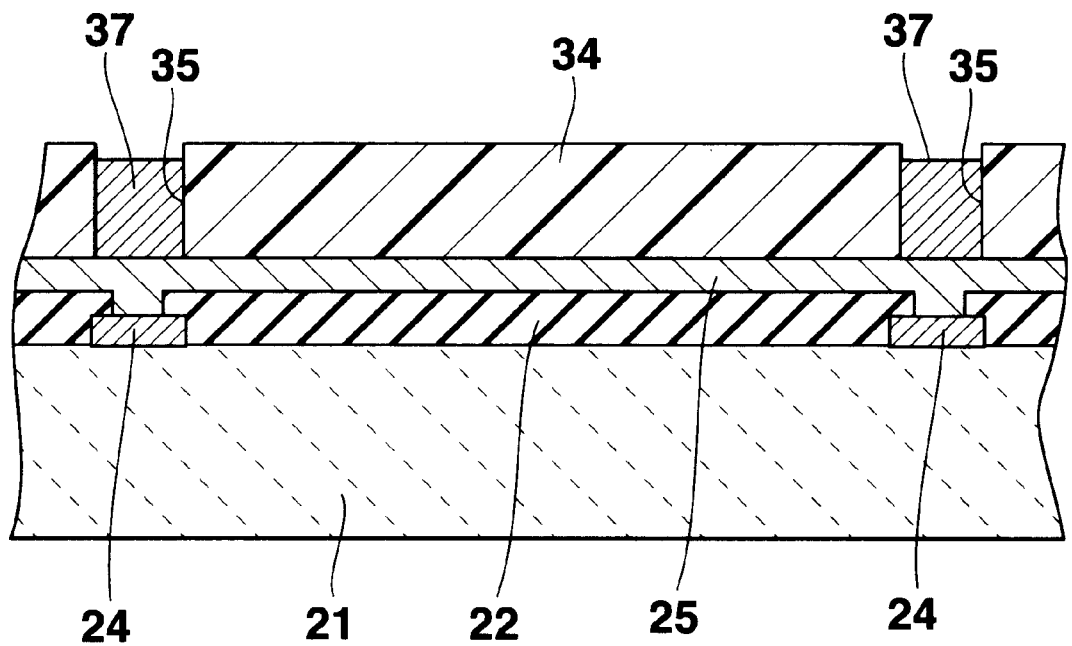
FIG. 9B is a cross sectional view showing in a magnified fashion a part of the semiconductor substrate shown in FIG. 9A.

Then, an electroplating of copper or the like is performed by using the plating resist pattern as a mask and the metal film 14, the conductive member 26 and the underlying metal layer 25 as one of plating current passageways (for example, the metal film 14 etc. is electrically connected to the cathode electrode). As a result, a projecting electrode (thick metal film) 37 is formed on the underlying metal layer 25 within the open portion 34 of the plating resist pattern 34, as shown in FIGS. 9A and 9B. Likewise, a dummy projecting electrode (dummy plating layer) 38 is formed on the metal film 14 within the open portion 36 for forming the dummy projecting electrode. In this case, any of a dipping method, a face down method and a face up method can be employed as the electroplating method. In the case of the dipping method, an electroplating is performed by dipping the plating tray 11 in a plating liquid except the upper side portion, i.e., the residual one side at which the metal film 14 is exposed to the outside. To be more specific, the exposed portion of the metal film 14, which is not dipped in the plating liquid, is used as an external plating electrode.

To reiterate, used is the plating tray 11 having the metal film 14 arranged around the recessed region 13, which is a semiconductor substrate arranging region, formed on one surface of the insulating substrate 12. Since the electroplating is performed by using the metal film 14 as one of the plating current passageways, a single plating apparatus can be used for performing various kinds of electroplating regardless of the kinds of the semiconductor substrate 21 by changing the size and shape of the recessed region 13 of the plating tray 11. It should also be noted that the projecting electrode 37 is formed on the front surface side of the semiconductor substrate 21 housed in the recessed region 13 of the plating tray 11, and the dummy projecting electrode 38 is formed around the silicon substrate 21. Because of the particular construction, it is possible to ensure a sufficiently large area for forming the dummy projecting electrode on the metal film 14 around the silicon substrate 21. It follows that it is possible to further improve the uniformity in height of the columnar projecting electrodes 37 formed within the effective area of the semiconductor substrate 21. Particularly, since the metal film 14 around the semiconductor substrate 21 is used as an area for forming the dummy projecting electrode, a sufficient effect can be obtained in the present invention.

In the next step, the plating resist pattern 24 is heated to a predetermined using a peeling agent so as to peel off the plating resist pattern 24, followed by taking the semiconductor substrate 21 out of the recessed region 13 of the plating tray 11. Then, the undesired portion of the underlying metal layer 25 is removed by dry etching or a wet etching with the projecting electrode 37 and the dummy projecting electrode 38 used as a mask, followed by dicing the semiconductor substrate 21 along the dicing line denoted by a dot-and-dash line shown in FIG. 7 so as to obtain a plurality of semiconductor chips (semiconductor devices) each of which is shown in FIG. 10. As described previously, the amounts of metal impurities such as Na, K, Ca and Cu contained in the dry photoresist film 31 used in this embodiment are less than about $1/10$ to $1/20$ of those in the dry photoresist film available on the market. As a result, after the dry photoresist film 31 was peeled off, it was possible to diminish the amounts of these metal impurities attached to the projecting electrode 37 and to the semiconductor substrate 21 positioned between adjacent projecting electrodes 37, with the result that it was possible to suppress completely the defective insulation.

In the manufacturing method of the semiconductor device (or forming method of the projecting electrode), the semiconductor substrate 21 in a wafer state is mounted to the plating tray 11, making it possible to facilitate the handling such as transference of the semiconductor substrate 21, compared with the case where the semiconductor substrate 21 in a wafer state is transferred independently. It is also possible to suppress the damage done to the semiconductor substrate 21. It should also be noted that, since the area for forming the dummy projecting electrode can be formed outside the semiconductor substrate 21, the effective area for forming the semiconductor device is increased. It follows that a larger number of semiconductor chips (semiconductor devices) can be obtained from a single wafer.

Figure 11:
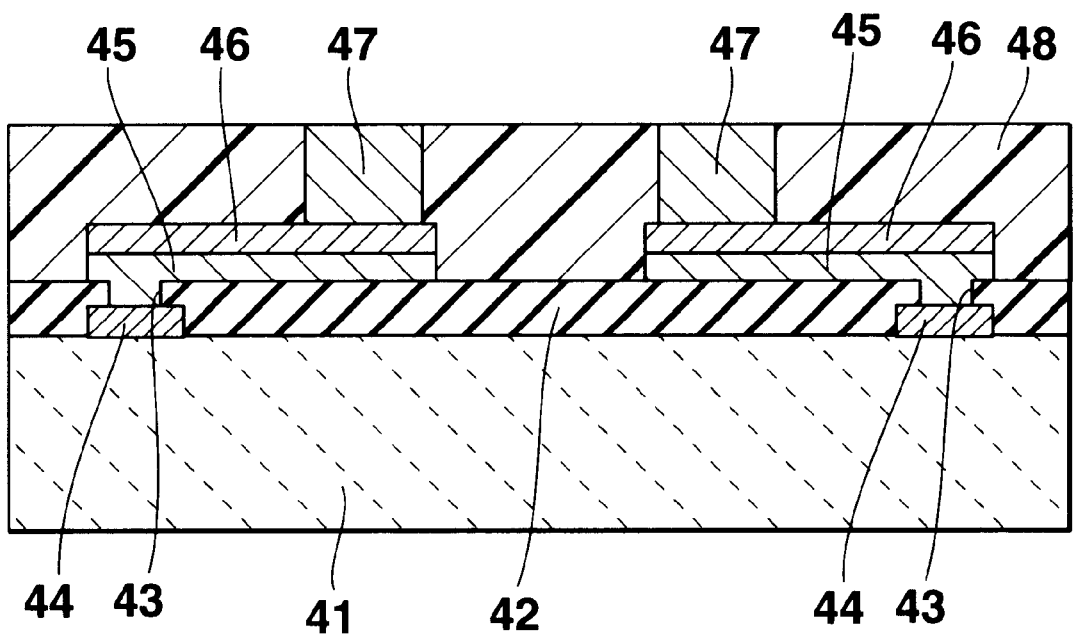
FIG. 11 is a cross sectional view showing a semiconductor device manufactured by a method according to a second embodiment of the present invention.

In the embodiment described above, the projecting electrode 37 is formed on the connection pad 24 of the semiconductor substrate 21. However, the technical idea of the present invention is not limited to the particular case. Alternatively, it is also possible to form, for example, a distribution-wiring 46 and a projecting electrode 47 by using the plating tray 11 in manufacturing a semiconductor device called CSP (chip size package), as shown in FIG. 11.
[Second Embodiment]

Figure 12A:
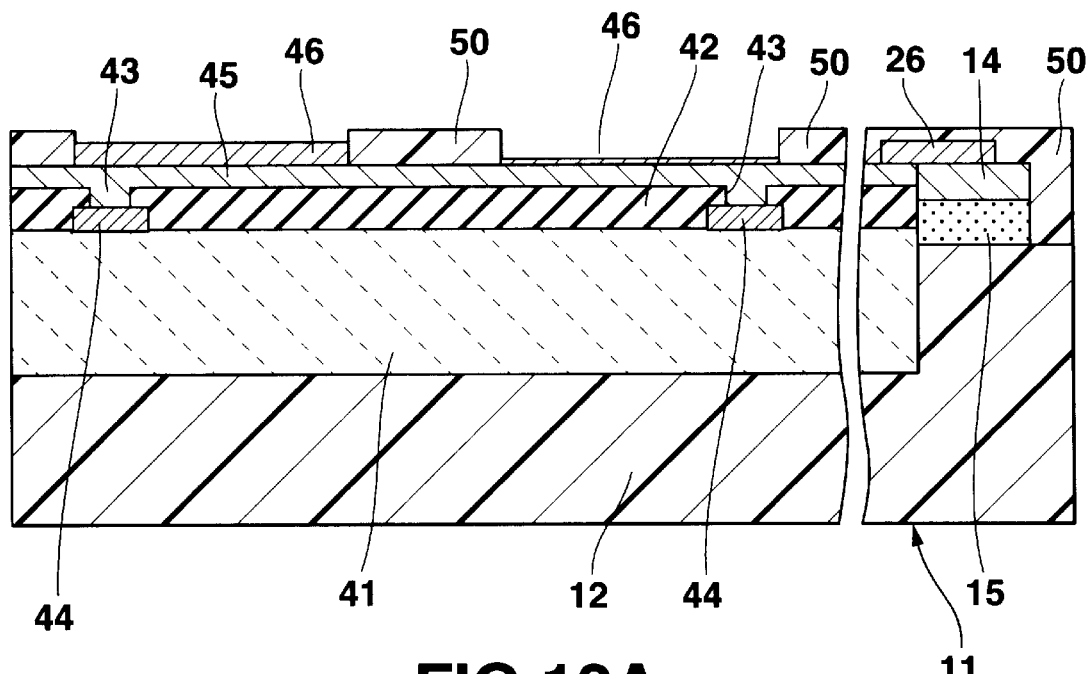
FIG. 12A is a cross sectional view showing in a magnified fashion a gist portion of the manufacturing step of the semiconductor device shown in FIG. 11.
Figure 12B:
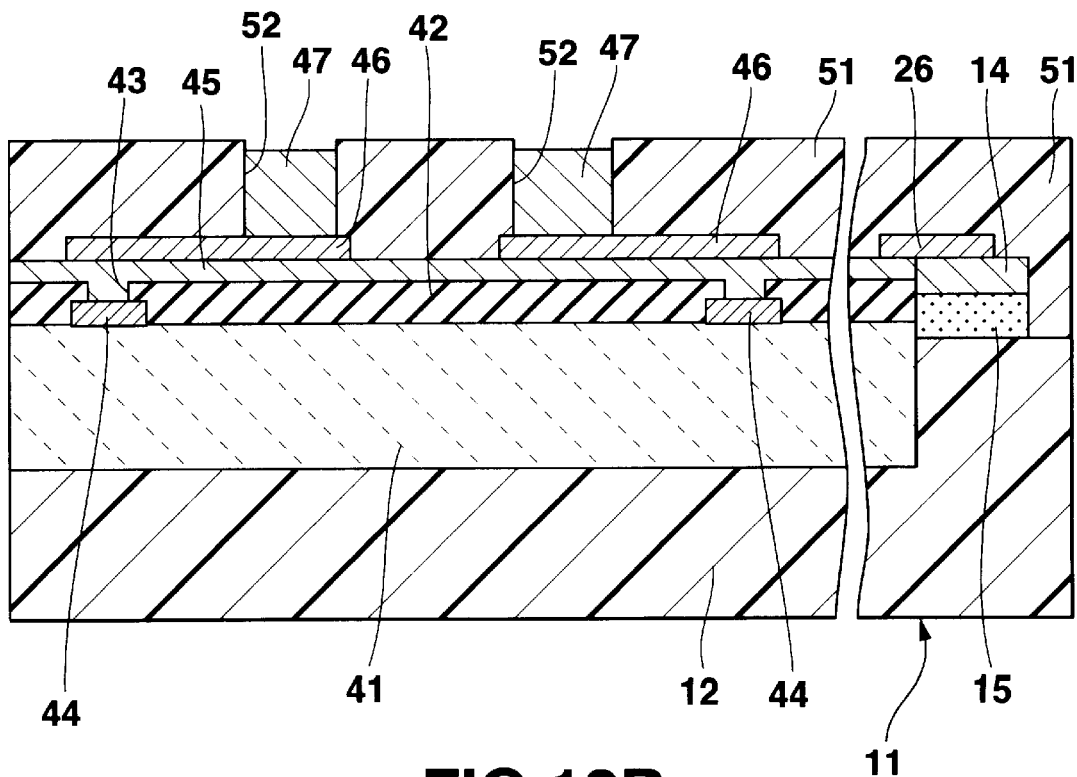
FIG. 12B is a cross sectional view showing in a magnified fashion a part of the manufacturing step following the step shown in FIG. 12A.
Figure 13A:
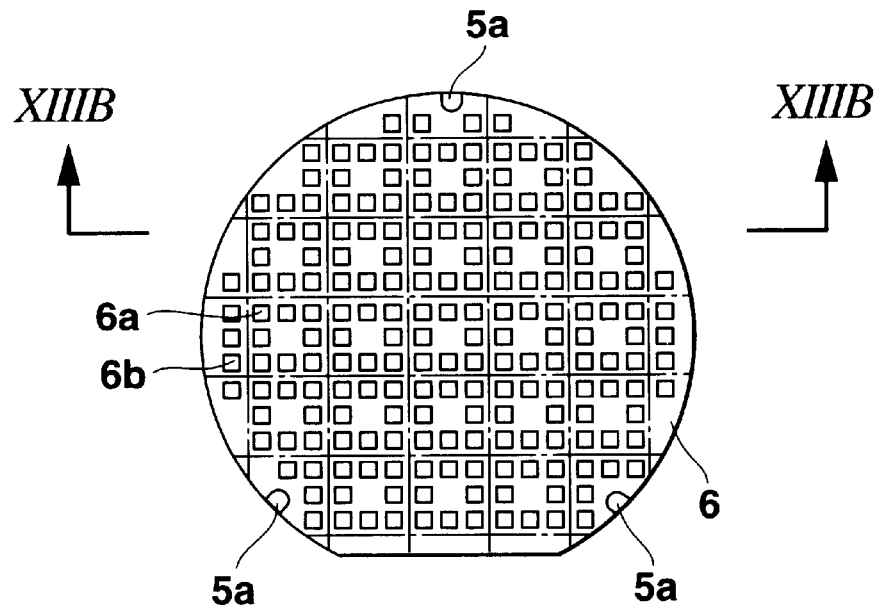
FIG. 13A is a plan view exemplifying a conventional method of manufacturing a semiconductor device.
Figure 13B:
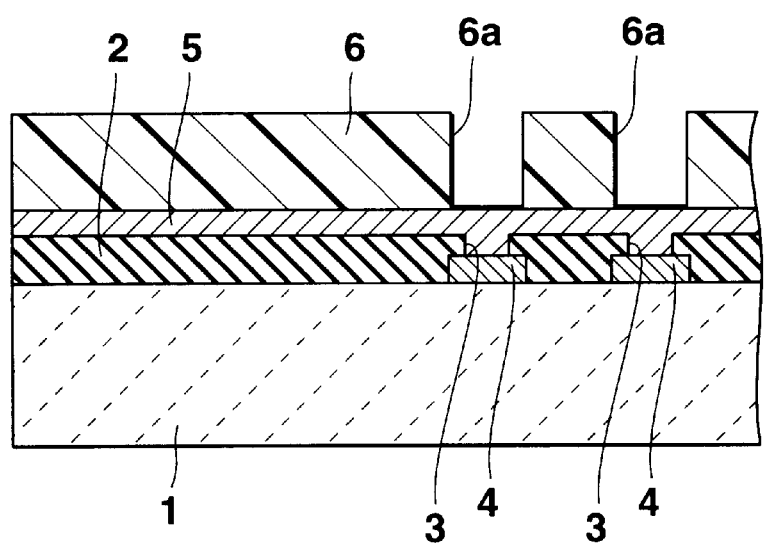
FIG. 13B is a cross sectional view along the line XIIIB—XIIIB shown in FIG. 13A.
Figure 14:
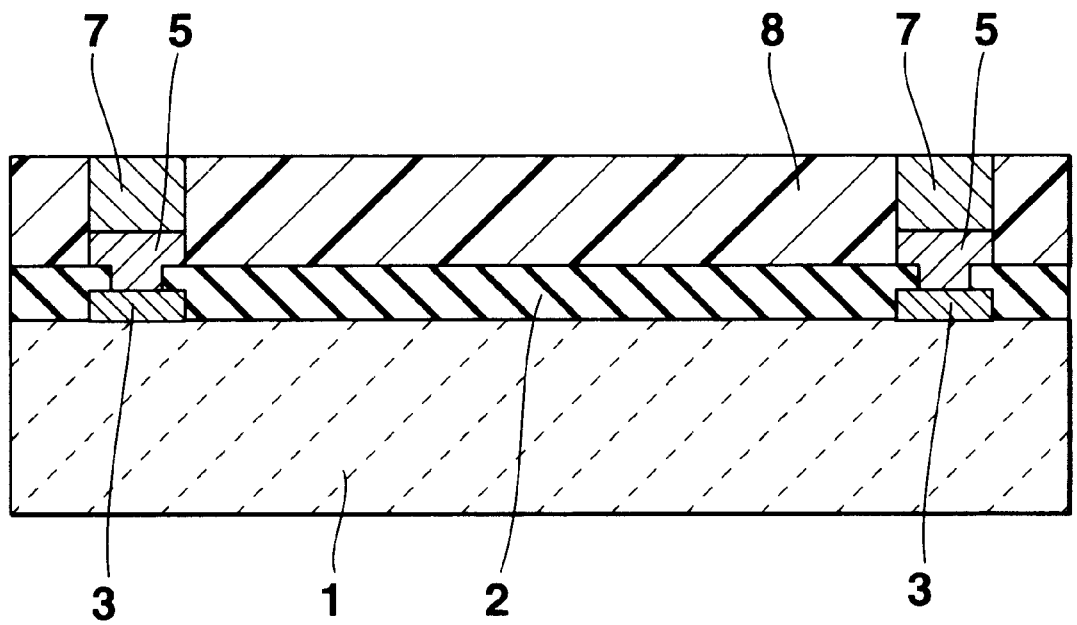
FIG. 14 is a cross sectional view showing in a magnified fashion the semiconductor device manufactured by the conventional method shown in FIGS. 13A and 13B.

A method of forming a projecting electrode included in the semiconductor device shown in FIG. 11 will now be described with reference to FIGS. 12A and 12B. In the first step, prepared is a semiconductor substrate 41 in a wafer state having a connection pad 44 and an insulating film 42 formed on one main surface having an integrated circuit formed therein. The insulating film 42 is provided with an open portion 43 for exposing the central portion on the upper surface of the connection pad 44. Then, an underlying metal layer 45 is formed on the insulating film 42 and on the connection pad 44 exposed to the outside through the open portion 43. The semiconductor substrate 41 having the metal layer 45 is arranged within a recessed region of the plating tray 11. Then, as in the first embodiment, the underlying metal layer 45 is electrically connected to the metal film 14 via a conductive member 26. In the next step, a dry photoresist film is formed to cover the semiconductor substrate 41 and the plating tray 11. As in the first embodiment, the dry photoresist film contains very low concentrations of metal impurities. For example, the dry photoresist film contains Na in an amount of at most 100 ppb, K in an amount of at most 50 ppb, Ca in an amount of at most 50 ppb, and Cu in an amount of at most 50 ppb. It should be noted, however, that it suffices for the dry photoresist film to have a thickness of about 5 µm to 50 µm. A plating resist pattern 50 for forming a distribution-wiring 46 is formed by light exposure and development of the dry photoresist film using a mask. Then, a distribution-wiring (thick metal film) 46 consisting of copper or the like is formed in a thickness of about 5 to 40 µm on the underlying metal layer 45 by an electroplating method using the underlying metal layer 45 as one of the plating current passageways. For example, the underlying metal layer 45 is connected to the cathode electrode via the metal film 14. The resultant structure is shown in FIG. 12A. In this case, it is possible to form an open portion for forming a dummy wiring in the plating resist layer 50 in addition to the open portion for forming the distribution-wiring layer. Then, the plating resist layer 50 for forming the distribution-wiring layer is peeled off, followed by forming a plating resist layer 51 for forming a projecting electrode. A dry photoresist having low concentrations of impurities is used in this step, too, as the plating resist. For example, the dry photoresist should contain at most 100 ppb of Na, at most 50 ppb of K, at most 50 ppb of Ca and at most 50 ppb of Cu. Also, the dry photoresist should have a thickness of 50 µm to 200 µm. The plating resist pattern 51 is formed as in the first embodiment, except that the open portions 52 are formed at one edge side of a distribution-wiring layer 46 connected to a connection pad 44 and at the other edge side of another distribution-wiring layer 46 connected to another connection pad 44. Then, the projecting electrode 47 consisting of copper or the like is formed on the other edge of the distribution-wiring 46 by an electroplating method using the underlying metal layer 45 as one of plating current passageways. For example, the underlying metal layer 45 is connected to the cathode electrode via the metal film 14. In this case, an open portion for forming a dummy projecting electrode (not shown in FIG. 12B) is also formed together with the open portion 52 for forming the projecting electrode in the plating resist pattern 51 for forming the projecting electrode, as shown in FIG. 12B. After formation of the projecting electrode 47, the plating resist pattern 51 is peeled off, and the undesired portion of the underlying metal layer 45 is removed by etching using the projecting electrode 47 and the distribution-wiring 46 as a mask. It is possible to carry out the etching treatment after the semiconductor substrate 21 is taken out of the plating tray 11. Then, the semiconductor substrate 41 is taken out of the plating tray 11, and a resin sealing film 48 is formed on the entire surface of the semiconductor substrate 21, followed by dicing the semiconductor substrate 21 along the dicing line so as to obtain a plurality of semiconductor devices each of which is shown in FIG. 11.

As described above, a dry photoresist film containing very small amounts of metal impurities such as Na, K, Ca and Cu is used in the present invention. Therefore, the amounts of the metal impurities contained in the projecting electrode and in the semiconductor substrate positioned between adjacent projecting electrodes are very small in the present invention after peeling off of the dry photoresist film, making it possible to suppress completely the defective insulation. It should also be noted that a plating tray is prepared by forming a metal film on one surface of an insulating substrate. The metal film is formed to surround a region in which a semiconductor substrate is arranged. Since an electroplating is performed by using the metal film as one of the plating current passageways, a single plating apparatus can be used for carrying out various electroplating regardless of the kind of the semiconductor substrate by changing the size and shape of the semiconductor substrate arranging region of the plating tray.

In this case, if dummy columnar electrodes are formed on the metal film around the semiconductor substrate in addition to the columnar electrodes formed on the front surface of the semiconductor substrate arranged within the semiconductor substrate arranging region of the plating tray, it is possible to ensure a sufficiently large area for forming the dummy columnar electrodes on the metal film around the semiconductor substrate. It follows that it is possible to make the columnar electrodes formed within the effective area of the semiconductor substrate more uniform in height.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

preparing a semiconductor substrate having a main surface, and a plurality of connection pads formed on the main surface, said main surface being covered with an insulating film including open portions partly exposing each of said connection pads;

forming a metal layer electrically connected to said connection pads;

laminating a dry photoresist film on said metal films, said dry photoresist film containing at most 100 ppb of Na, at most 50 ppb of K, at most 50 ppb of Ca and at most 50 ppb of Cu;

forming an open portion in said dry photoresist film to expose partly each of the metal layers;

forming within said open portion by an electroplating a thick metal film electrically connected to the metal layer; and removing off said dry photoresist film from the metal films.

2. A method of manufacturing a semiconductor device according to claim 1, wherein the removing of the dry photoresist film is followed by additionally forming a sealing resin to cover the entire region of said semiconductor substrate and dicing the semiconductor substrate to obtain a plurality of individual semiconductor chips.

3. A method of manufacturing a semiconductor device according to claim 1, wherein said forming of the metal layers includes forming an underlying metal layer and forming a distribution-wiring on said underlying metal layer.

4. A method of manufacturing a semiconductor device according to claim 1, wherein said forming of an open portion in said dry photoresist film includes forming an open portion for forming a dummy thick metal layer in that region of the dry photoresist film which corresponds to a region outside the effective area of the semiconductor substrate.

5. A method of manufacturing a semiconductor device according to claim 1, wherein mounting said semiconductor substrate to a semiconductor substrate arranging region of a plating tray is interposed between the preparing of the semiconductor substrate and forming of the metal layers.

6. A method of manufacturing a semiconductor device according to claim 5, wherein a metal film is formed in that region of said plating tray which surrounds the semiconductor substrate arranging region.

7. A method of manufacturing a semiconductor device according to claim 6, wherein laminating of said dry photoresist film includes laminating said dry photoresist film to cover the semiconductor substrate and around the semiconductor substrate arranging region of said plating tray.

8. A method of manufacturing a semiconductor device according to claim 7, wherein forming of an open portion in said dry photoresist film includes the step of forming an open portion for forming a dummy thick metal film in that region of the dry photoresist film which surrounds the semiconductor substrate arranging region of the plating tray.

9. A method of manufacturing a semiconductor device according to claim 7, wherein the open portion for forming a projecting electrode in said dry photoresist film is substantially equal in area to the open portion for forming the dummy thick metal film.

10. A method of manufacturing a semiconductor device, comprising:
preparing a semiconductor substrate having a main surface, a plurality of connection pads being formed on said main surface and the entire region of said one main surface, which includes said plural connection pads, being covered with a metal layer;
preparing a plating tray having a semiconductor substrate arranging region and a metal film formed to surround the semiconductor substrate arranging region;
mounting the semiconductor substrate in said semiconductor substrate arranging region of said plating tray;
electrically connecting the metal layer of the semiconductor substra te to the metal film of the plating tray;
covering the semiconductor substrate and the semiconductor substrate arranging region of the plating tray with a plating resist;
forming an open portion for forming a projecting electrode, in that region of the plating resist which corresponds to the semiconductor substrate and also forming an open portion for forming a dummy projecting electrode, in that region of the plating resist which corresponds to the semiconductor substrate arranging region of the plating tray;
forming a projecting electrode by electroplating in each of the open portion for forming the projecting electrode of the plating resist and in the open portion for forming the dummy projecting electrode of the plating resist; and
removing the plating resist from the semiconductor substrate and the plating tray.

11. A method of manufacturing a semiconductor device according to claim 10, wherein the metal film formed on said plating tray includes a non-plating region exposed from said plating resist.

12. A method of manufacturing a semiconductor device according to claim 11, wherein said forming of a projecting electrode is performed by dipping said plating tray having said semiconductor substrate mounted thereto in a plating liquid except the non-plating region of the metal film formed on the plating tray.

13. A method of manufacturing a semiconductor device according to claim 10, wherein a recessed region for housing the semiconductor substrate is formed in the semiconductor substrate arranging region of the plating tray.

14. A method of manufacturing a semiconductor device according to claim 10, wherein the depth of the recessed region of the plating tray is smaller than the thickness of the semiconductor substrate.

15. A method of manufacturing a semiconductor device according to claim 10, wherein said plating resist is a dry photoresist film.

16. A method of manufacturing a semiconductor device according to claim 10, wherein forming of a projecting electrode within an open portion of the plating resist comprises wetting the plating resist in the circumferential peripheral region of the open portion for the plating, and dipping the plating tray having the semiconductor substrate mounted thereto in a plating liquid.

17. A method of manufacturing a semiconductor device according to claim 10, wherein at least one of a conductive ink, a metal foil and a metal film is used in electrically connecting of the metal layer of the semiconductor substrate to the metal film of the plating tray.

18. A method of manufacturing a semiconductor device according to claim 10, wherein the open portion for forming the projecting electrode in the plating resist is substantially equal in are to the open portion for forming the dummy projecting electrode.

19. A method of manufacturing a semiconductor device, comprising:
preparing a semiconductor substrate having a plurality of connection pads formed on a main surface and an underlying metal layer electrically connected to said connection pads;
preparing a plating tray having a region in which said semiconductor substrate is mounted;
mounting the semiconductor substrate to said semiconductor substrate mounting region of the plating tray;
forming a plurality of distribution-wiring on the underlying metal layer of the semiconductor substrate;
forming a plating resist layer having a thickness of at least 60 $\mu$m on the semiconductor substrate having the distribution-wiring formed thereon;
forming an open portion partly exposing each of the distribution-wiring in the plating resist;
dipping the plating tray in a plating liquid to carry out an electroplating with the underlying metal plate used as one of the plating current passageways so as to form a projecting electrode within the open portion of the plating resist;
peeling the plating resist, followed by forming a sealing resin layer to cover the semiconductor substrate; and
dicing the semiconductor substrate to obtain a plurality of individual semiconductor chips.

20. A method of manufacturing a semiconductor device according to claim 19, wherein forming of re-wirings includes forming a plating resist pattern having open portions formed in regions in which said re-wiring are to be formed on the underling metal layer, and carrying out an electroplating with the underlying metal layer used as one of the plating current passageways so as to form re-wiring in each of said open portions of the plating resist pattern.

* * * * *